(12) United States Patent
Cheruku et al.

(10) Patent No.: US 11,935,577 B2
(45) Date of Patent: Mar. 19, 2024

(54) PHYSICAL INTERFACE AND ASSOCIATED SIGNAL PROCESSING METHOD FOR CLOCK DOMAIN TRANSFER OF QUARTER-RATE DATA

(71) Applicant: Faraday Technology Corp., Hsin-Chu (TW)

(72) Inventors: Sridhar Cheruku, Karnataka (IN); Sivaramakrishnan Subramanian, Karnataka (IN); Hussainvali Shaik, Karnataka (IN); Ko-Ching Chao, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 213 days.

(21) Appl. No.: 17/667,499

(22) Filed: Feb. 8, 2022

(65) Prior Publication Data
US 2023/0253028 A1 Aug. 10, 2023

(51) Int. Cl.
*G11C 7/22* (2006.01)
*G11C 7/10* (2006.01)
*G11C 11/4076* (2006.01)
*G11C 11/4096* (2006.01)

(52) U.S. Cl.
CPC ........ *G11C 11/4076* (2013.01); *G11C 7/1093* (2013.01); *G11C 7/222* (2013.01); *G11C 11/4096* (2013.01); *G11C 7/1087* (2013.01)

(58) Field of Classification Search
CPC ... G11C 11/4076; G11C 7/1093; G11C 7/222; G11C 11/4096; G11C 7/1087
See application file for complete search history.

(56) References Cited

U.S. PATENT DOCUMENTS

| | | | | |
|---|---|---|---|---|
| 6,147,632 | A * | 11/2000 | Iwasaki | H03H 17/0642 331/74 |
| 11,477,057 | B1 * | 10/2022 | Bhuta | H04L 25/0272 |
| 2007/0025175 | A1 * | 2/2007 | Liu | G11C 7/1012 365/233.11 |
| 2010/0122104 | A1 * | 5/2010 | Defazio | G11C 7/22 713/401 |
| 2013/0028313 | A1 * | 1/2013 | Shen | H04L 25/03057 375/233 |
| 2013/0342240 | A1 * | 12/2013 | Amirkhany | H04L 25/03949 327/50 |
| 2019/0288830 | A1 * | 9/2019 | Zhuang | H04L 7/0337 |
| 2022/0337385 | A1 * | 10/2022 | Gao | H04L 7/0016 |

FOREIGN PATENT DOCUMENTS

TW 202037080 A 10/2020

* cited by examiner

*Primary Examiner* — Mushfique Siddique
(74) *Attorney, Agent, or Firm* — Winston Hsu (57) ABSTRACT

The present invention provides a physical layer and associated signal processing method for clock domain transfer of quarter-rate data. In the embodiments of the present invention, the quarter-rate data is processed by many sampling circuits by using a first clock signal, a second clock signal and a third clock signal, and phases of these clock signals are aligned by using a training mechanism to that the clock signals have better timing margins.

20 Claims, 10 Drawing Sheets

PHYSICAL INTERFACE AND ASSOCIATED SIGNAL PROCESSING METHOD FOR CLOCK DOMAIN TRANSFER OF QUARTER-RATE DATA

BACKGROUND OF THE INVENTION

1. Field of the Invention

The present invention relates to a method for clock domain transfer of quarter-rate data.

2. Description of the Prior Art

In a physical interface of a double data rate synchronous dynamic random access memory (DDR SDRAM), a clock domain transfer of data from an internal clock to a write clock is critical at high frequency. In addition, due to the on-chip variation, a circuitry for clock domain transfer will encounter many difficulties in the design, such as static skew among clocks and synchronicity of various data. Therefore, how to design a physical interface with better timing performance is an important topic.

SUMMARY OF THE INVENTION

It is therefore an objective of the present invention to provide a physical interface having better timing margin for data transfer, to solve the above-mentioned problems.

According to one embodiment of the present invention, a physical layer comprising a first group of sampling circuits, a second group of sampling circuits, a first multiplexer, a second multiplexer, a third group of sampling circuits and a third multiplexer is disclosed. The first group of sampling circuits is configured to use a first clock signal to sample a plurality of data to generate a plurality of first sampled data, respectively. The second group of sampling circuits is configured to use a second clock signal to sample the plurality of first sampled data to generate a plurality of second sampled data, respectively. The first multiplexer is configured to select one of a first signal and a second signal to generate a first multiplexer output, wherein the first signal and the second signal are obtained from part of the plurality of second sampled data. The second multiplexer is configured to select one of a third signal and a fourth signal to generate a second multiplexer output, wherein the third signal and the fourth signal are obtained from another part of the plurality of second sampled data. The third group of sampling circuits is configured to use a third clock signal to sample the first multiplexer output signal and the second multiplexer output signal to generate a plurality of third sampled data, respectively. The third multiplexer is configured to alternatively select one of the plurality of third sampled data to generate an output signal.

According to one embodiment of the present invention, a signal processing method comprises the steps of: using a first clock signal to sample a plurality of data to generate a plurality of first sampled data, respectively; using a second clock signal to sample the plurality of first sampled data to generate a plurality of second sampled data, respectively; selecting one of a first signal and a second signal to generate a first multiplexer output, wherein the first signal and the second signal are obtained from part of the plurality of second sampled data; selecting one of a third signal and a fourth signal to generate a second multiplexer output, wherein the third signal and the fourth signal are obtained from another part of the plurality of second sampled data; using a third clock signal to sample the first multiplexer output signal and the second multiplexer output signal to generate a plurality of third sampled data, respectively; and alternatively selecting one of the plurality of third sampled data to generate an output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
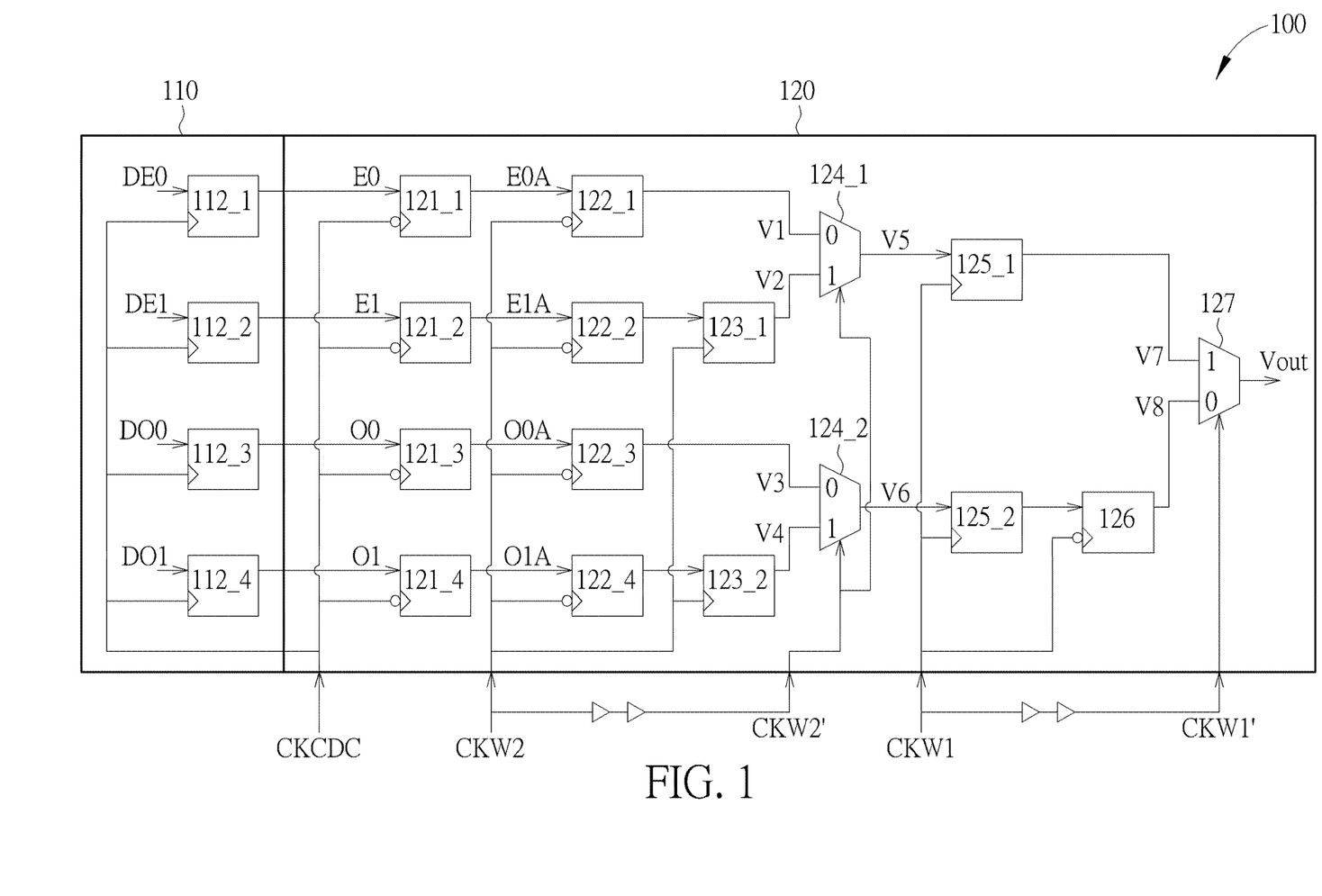
FIG. 1 is a physical interface of a DDR SDRAM according to one embodiment of the present invention.

FIG. 1 is a physical interface 100 of a DDR SDRAM according to one embodiment of the present invention. As shown in FIG. 1, the physical interface 100 comprises a digital part 110 and an analog part 120, wherein the digital part 110 comprises four sampling circuits such as four D-type flip-flops (DFF) 112_1-112_4; and the analog part 120 comprises a first group of sampling circuits including four DFFs 121_1-121_4, a second group of sampling circuits including four DFFs 122_1-122_4, two sampling circuits including two DFFs 123_1 and 123_2, two multiplexers 124_1 and 124_2, a third group of sampling circuits including three DFFs 125_1, 125_2, 126 and a multiplexer 127. In the physical interface 100 shown in FIG. 1, the physical interface 100 is configured to receive digital data DE0, DE1, DO0 and DO1 with quarter data rate to generate an output signal Vout according to clock signals CKCDC, CKW2 and CKW1, wherein a frequency of the clock signal CKCDC is substantially equal to a frequency of the clock signal CKW2, and a frequency of the clock signal CKW1 is twice the frequency of the clock signal CKW2.

Figure 2:
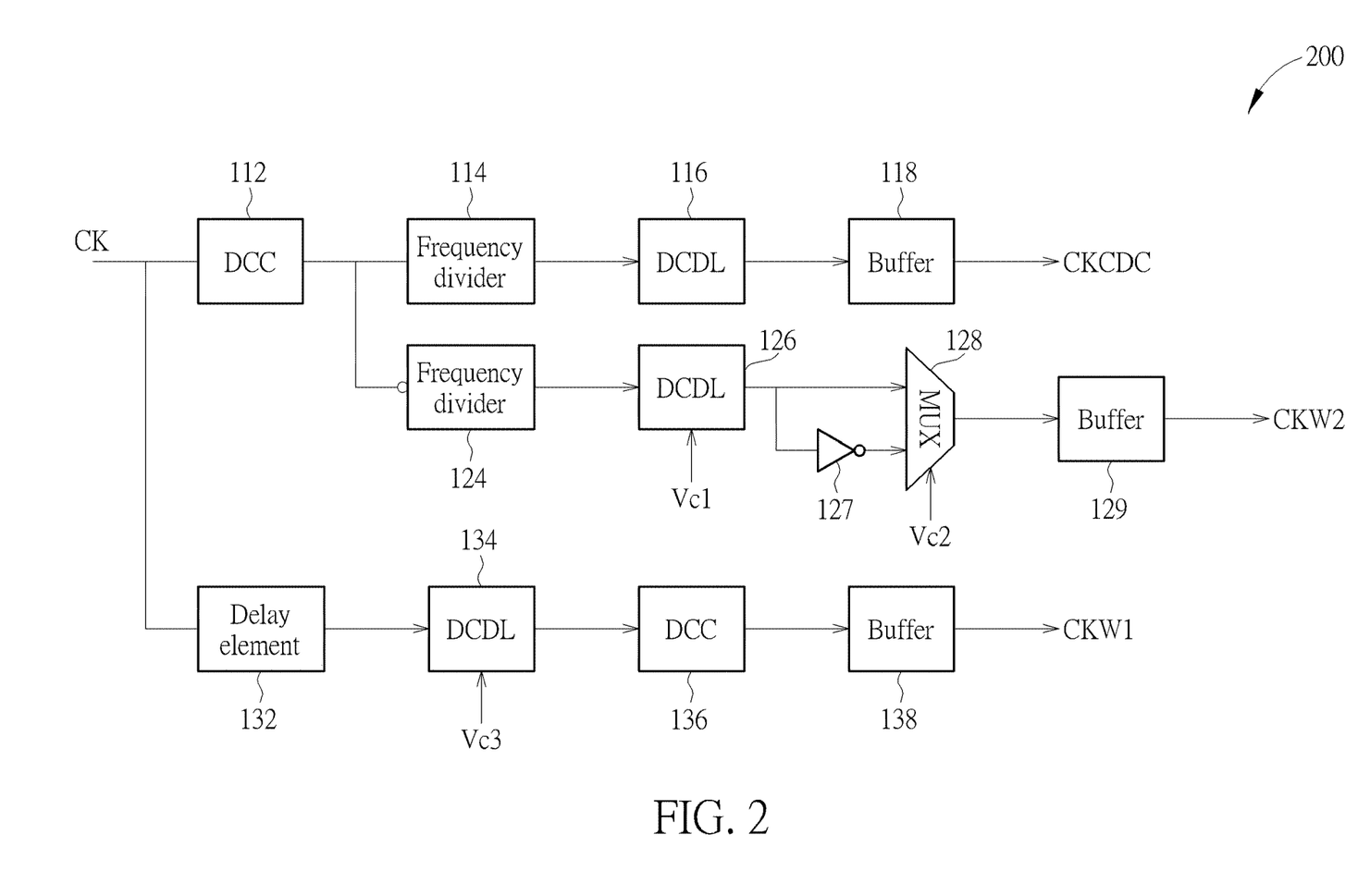
FIG. 2 is a diagram illustrating a clock signal generator according to one embodiment of the present invention.

FIG. 2 is a diagram illustrating a clock signal generator 200 according to one embodiment of the present invention, wherein the clock signal generator may be within the physical interface 100. As shown in FIG. 2, the clock signal generator 200 comprises a first path for generating the clock signal CKCDC, a second path for generating the clock signal CKW2, and a third path for generating the clock signal CKW1. The first path comprises a duty-cycle corrector (DCC) 112, a frequency divider 114, a digitally controlled delay line (DCDL) 116 and a buffer 118. The second path comprises a frequency divider 124, a DCDL 126, an inverter 127, a multiplexer 128 and a buffer 129. The third path comprises a delay element 132, a DCDL 134, a DCC 136 and a buffer 138. In the operation of the first path of the clock signal generator 200, the DCC 112 receives a clock signal CK from an phase-locked loop and adjusts the duty cycle of the clock signal CK so that duty cycle of the adjusted clock signal is equal to 50%. Then, the frequency divider 114 performs a frequency dividing operation with a divisor "2" on the clock signal to generate a frequency-divided clock signal. Then, the frequency-divided clock signal goes through the DCDL 116 and the buffer 118 to generate the clock signal CKCDC, wherein the frequency of the clock signal CKCDC is half the frequency of the clock signal CK.

In the operation of the second path of the clock signal generator 200, the frequency divider 124 performs a frequency dividing operation with a divisor "2" on the clock signal outputted by the DCC 112 to generate a frequency-divided clock signal, based on a trigger of a falling edge of the clock signal outputted by the DCC 112. Then, the DCDL 126 delays the frequency-divided clock signal to generate a delayed clock signal. Then, the inverter 127 receives the delayed clock signal to generate an inverted delayed clock signal, and the multiplexer 128 selects one of the delayed clock signal and the inverted delayed clock signal to generate an output clock signal. Then, the output clock signal goes through the buffer 129 to generate the clock signal CKW2, wherein the frequency of the clock signal CKW2 is half the frequency of the clock signal CK.

In the operation of the third path of the clock signal generator 200, the delay element 132 and the DCDL 134 delay the clock signal CK to generate a delayed clock signal. The DCC 136 receives the delayed clock signal from the DCDL 134 and adjusts the duty cycle of the delayed clock signal CK so that duty cycle of the adjusted clock signal is equal to 50%. Then, the adjusted clock signal goes through the buffer 138 to generate the clock signal CKW1, wherein the frequency of the clock signal CKW1 is substantially the same as the frequency of the clock signal CK.

Figure 3:
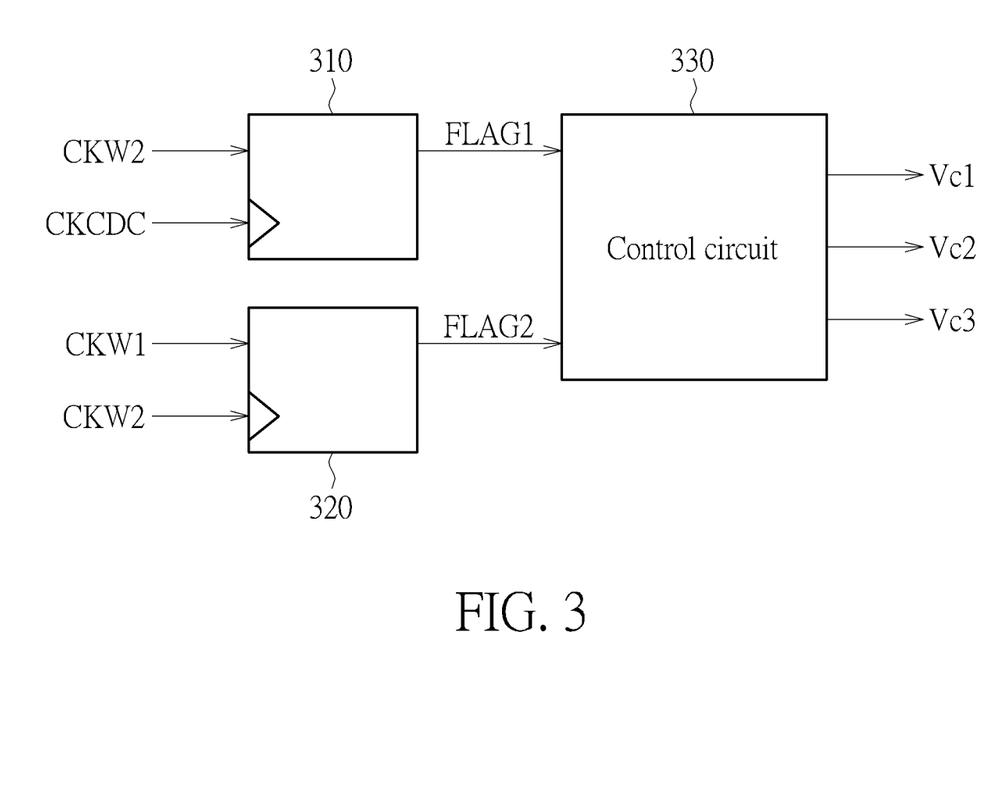
FIG. 3 shows a circuit for generating control signals of the clock signal generator according to one embodiment of the present invention.

In order to make the physical interface 100 output the correct data, the phases of the clock signals CKCDC, CKW2 and CKW1 need to controlled exactly, so that there is a great timing margin between the clock signals CKCDC and CKW2 and a great timing margin between the clock signals CKW2 and CKW1. Therefore, the embodiment provides a training mechanism that is able to generate control signals Vc1, Vc2 and Vc3 to control the DCDL 126, the multiplexer 128 and the DCDL 134, respectively, to align the phases of the clock signals CKCDC, CKW2 and CKW1. FIG. 3 is a diagram showing a control circuit 330 to generate the control signals Vc1, Vc2 and Vc3. In FIG. 3, a DFF 310 is configured to use the clock signal CKCDC to sample the clock signal CKW2 to generate a sampling result FLAG1, a DFF 320 is configured to use the clock signal CKW2 to sample the clock signal CKW1 to generate a sampling result FLAG2, and the control circuit 330 receives the sampling results FLAG1 and FLAG2 to determine the appropriate control signals Vc1, Vc2 and Vc3. The detailed operations of the DFF 310, the DFF 320 and the control circuit 330 are described in FIG. 8 and FIG. 10.

Figure 4:
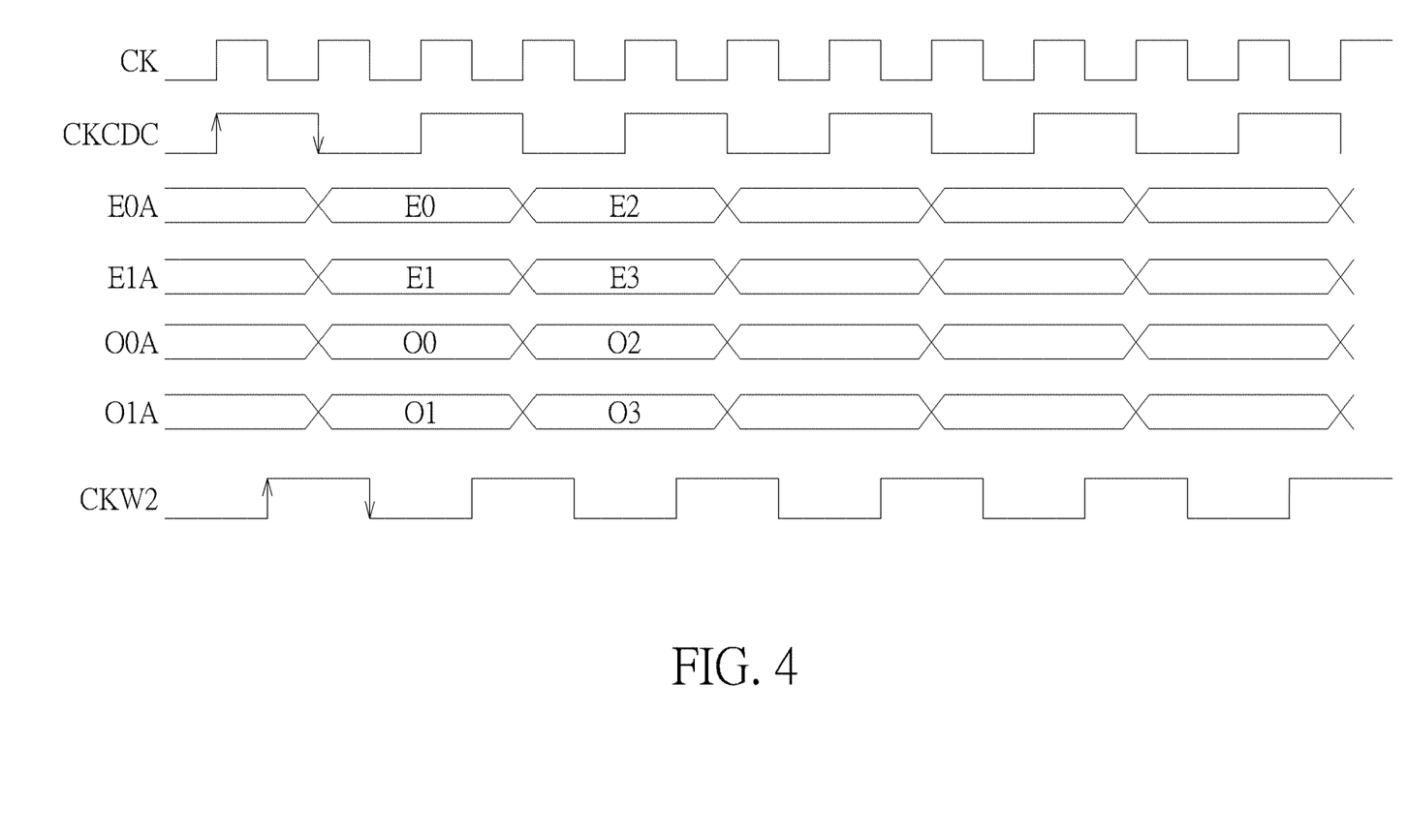
FIGS. 4-6 are timing diagrams of signals within the physical interface according to one embodiment of the present invention.
Figure 5:
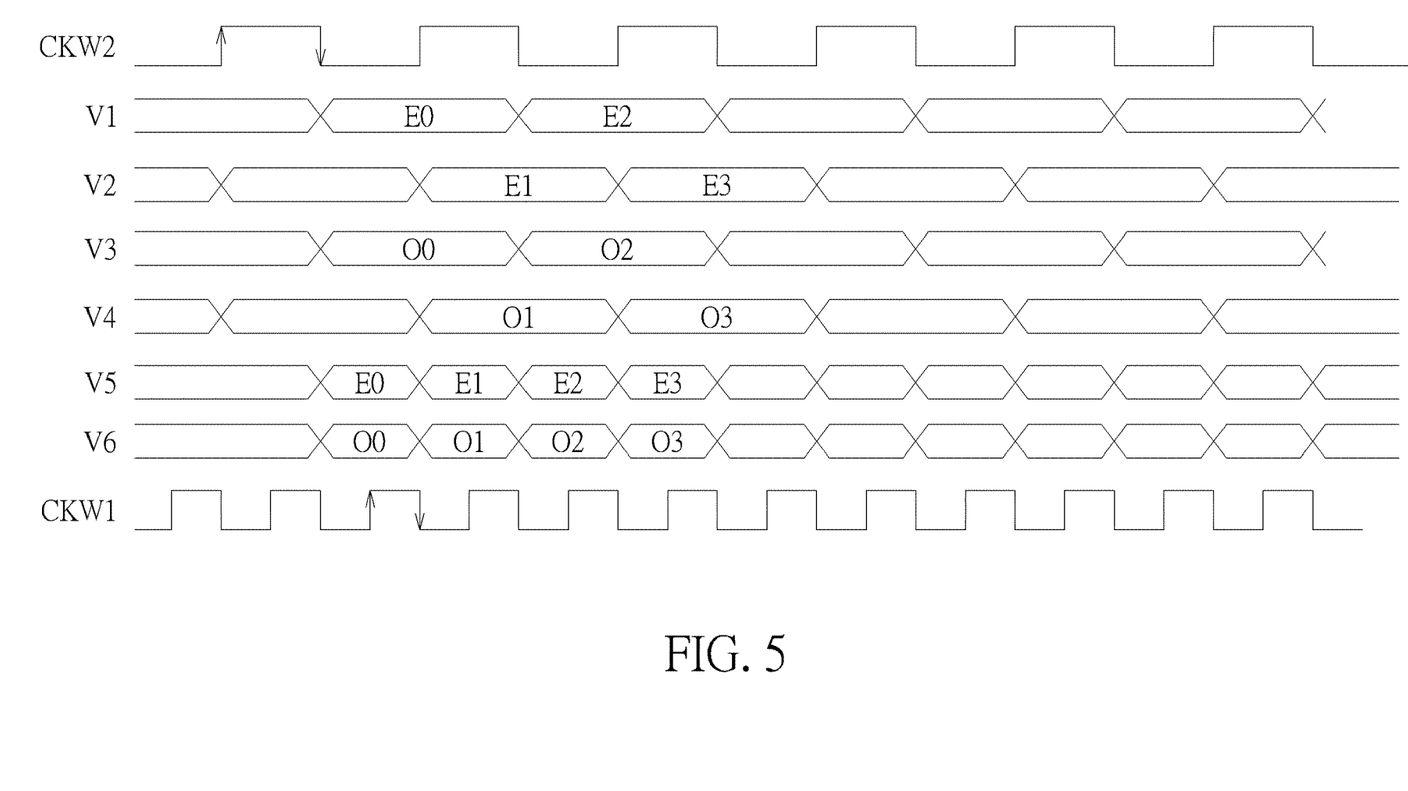
Figure 6:
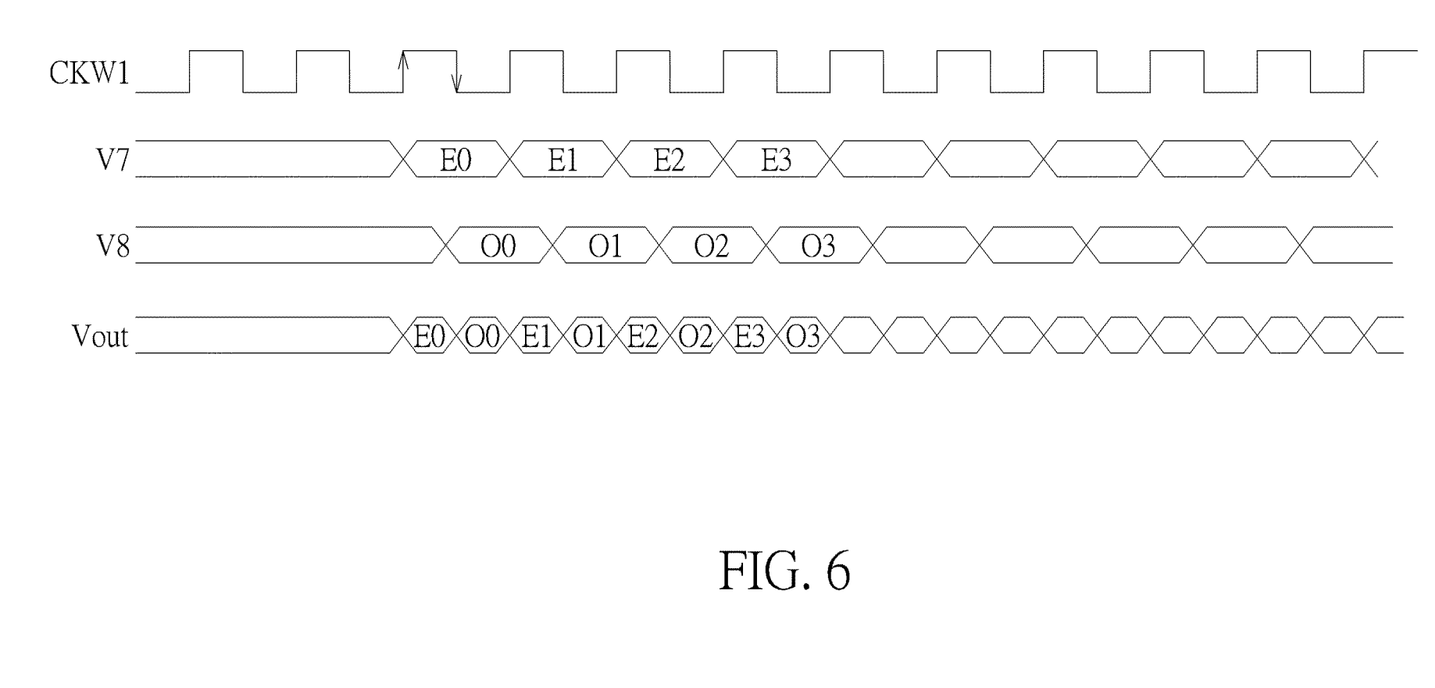

Please refer to FIG. 1 and FIGS. 4-6 together, FIGS. 4-6 are timing diagrams of signals within the physical interface 100. In the operation of the physical interface 100, the DFFs 112_1-112_4 use the clock signal CKCDC to sample the digital data DE0, DE1, DO0 and DO1 to generate the sampled data E0, E1, O0 and O1, respectively. In this embodiment, the DFFs 112_1-112_4 use a rising edge of the clock signal CKCDC to sample the digital data DE0, DE1, DO0 and DO1, but it is not a limitation of the present invention. Then, the DFFs 121_1-121_4 use the clock signal CKCDC to sample the data E0, E1, O0 and O1 to generate the sampled data E0A, E1A, O0A and O1A, respectively. In this embodiment, the DFFs 121_1-121_4 use a falling edge of the clock signal CKCDC to sample the data E0, E1, O0 and O1, but it is not a limitation of the present invention.

Then, the DFF 122_1 uses a falling edge of the clock signal CKW2 to sample the data E0A to generate a sampled signal V1. The DFF 122_2 uses the falling edge of the clock signal CKW2 to sample the data E1A to generate a sampled signal, and the DFF 123_1 uses a rising edge of the clock signal CKW2 to sample the sampled signal outputted by the DFF 122_2 to generate a sampled signal V2. The DFF 122_3 uses the falling edge of the clock signal CKW2 to sample the data O0A to generate a sampled signal V3. The DFF 122_4 uses the falling edge of the clock signal CKW2 to sample the data O1A to generate a sampled signal, and the DFF 123_2 uses the rising edge of the clock signal CKW2 to sample the sampled signal outputted by the DFF 122_4 to generate a sampled signal V4.

Then, the multiplexer 124_1 alternatively selects one of the sampled signals V1 and V2 to generate a multiplexer output signal V5 according to a delayed clock signal CKW2', wherein the delayed clock signal CKW2' is generated by using one or more delay elements to delay the clock signal CKW2. For example, referring to FIG. 5, when the delayed clock signal CKW2' has a lower voltage level, the multiplexer 124_1 selects the sampled signal V1 to serve as the multiplexer output signal V5; and when the delayed clock signal CKW2' has a higher voltage level, the multiplexer 124_1 selects the sampled signal V2 to serve as the multiplexer output signal V5. Similarly, the multiplexer 124_2 alternatively selects one of the sampled signals V3 and V4 to generate a multiplexer output signal V6 according to a delayed clock signal CKW2'. For example, referring to FIG. 5, when the delayed clock signal CKW2' has the lower voltage level, the multiplexer 124_2 selects the sampled signal V3 to serve as the multiplexer output signal V6; and when the delayed clock signal CKW2' has the higher voltage level, the multiplexer 124_2 selects the sampled signal V4 to serve as the multiplexer output signal V6.

Then, the DFF 125_1 uses a rising edge of the clock signal CKW1 to sample the sampled signal V5 to generate a sampled signal V7, the DFF 125_2 uses the rising edge of the clock signal CKW1 to sample the sampled signal V6, and the DFF 126 uses a falling edge of the clock signal CKW1 to sample an output signal of the DFF 125_2 to generate a sampled signal V8. Then, the multiplexer 127 alternatively selects one of the sampled signals V7 and V8 to generate the output signal Vout according to a delayed clock signal CKW1', wherein the delayed clock signal CKW1' is generated by using one or more delay elements to delay the clock signal CKW1. For example, referring to FIG. 6, when the delayed clock signal CKW1' has a higher voltage level, the multiplexer 127 selects the sampled signal V7 to serve as the output signal Vout; and when the delayed clock signal CKW1' has a lower voltage level, the multiplexer 127 selects the sampled signal V8 to serve as the output signal Vout.

Figure 7:
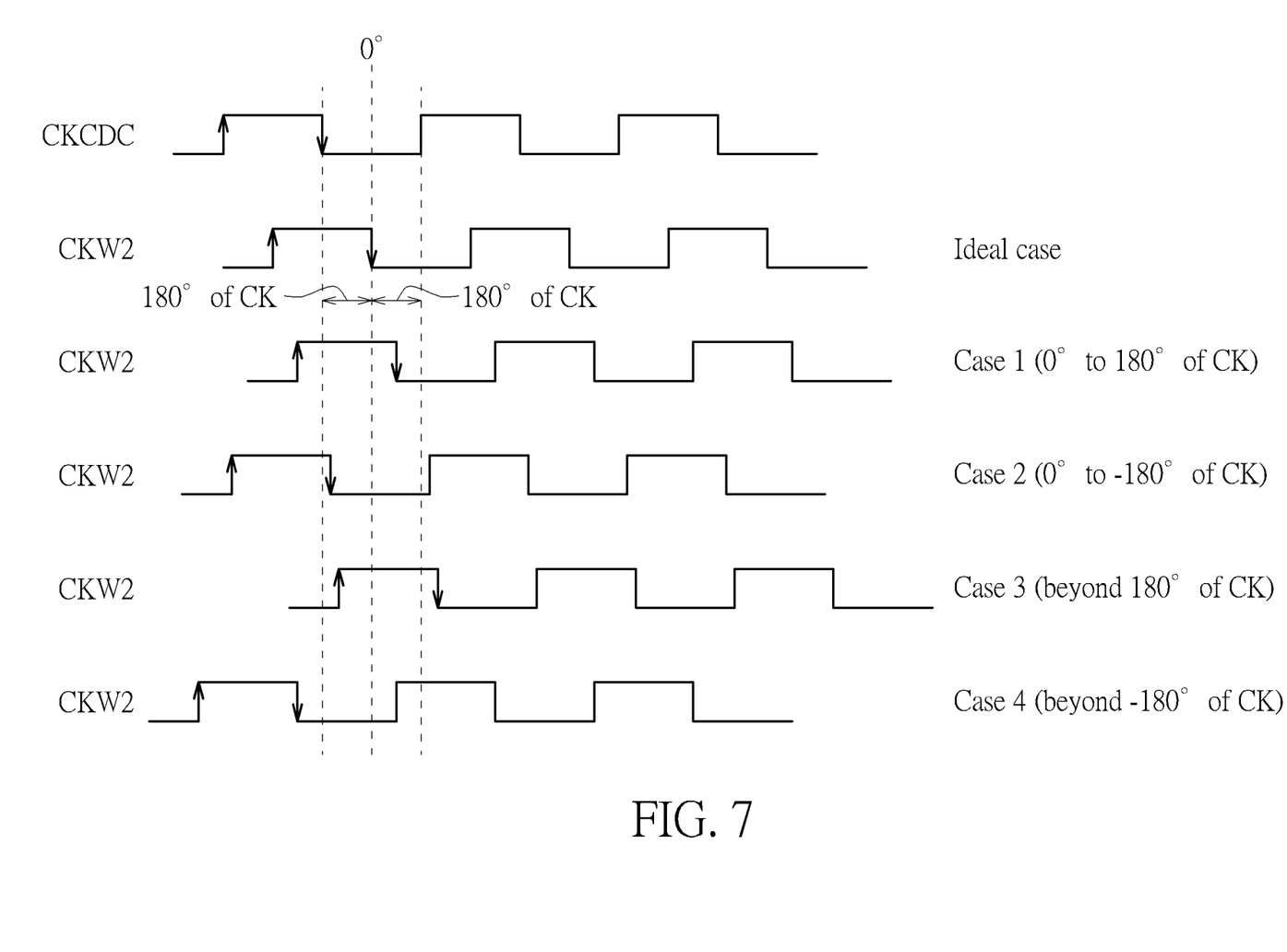
FIG. 7 shows phase differences between clock signals CKCDC and CKW2 for different cases.

The timing diagram shown in FIGS. 4-6 is an ideal case that phases of the clock signals CKCDC, CKW1 and CKW2 are aligned. However, due to the on-chip variations, the clock signals CKCDC, CKW1 and CKW2 may not have appropriate phases, so that the output signal Vout may have errors. For example, referring to FIG. 7, in an ideal case, a phase difference between the clock signals CKCDC and CKW2 is 180 degrees of the clock signal (i.e., 90 degrees of the clock signal CKCDC/CKW2), and in fact the phase difference between the clock signals CKCDC and CKW2 may belong to one of the following four cases that may make the physical interface 100 generate incorrect output signal Vout. For a case 1, the actual phase of the clock signal CKW2 leads the ideal case of the clock signal CKW2, and the phase lead of the clock signal CKW2 is between 0 degrees to 180 degrees of the clock signal CK (i.e., between 0 degrees to 90 degrees of the clock signal CKCDC/CKW2). For a case 2, the actual phase of the clock signal CKW2 lags behind the ideal case of the clock signal CKW2, and the phase lag of the clock signal CKW2 is between (0 degrees) to (−180 degrees) (i.e., between (0 degrees) to (−90 degrees) of the clock signal CKCDC/CKW2). For a case 3, the actual phase of the clock signal CKW2 leads the ideal case of the clock signal CKW2, and the phase lead of the clock signal CKW2 is beyond 180 degrees of the clock signal CK (i.e., beyond 90 degrees of the clock signal CKCDC/CKW2). For a case 4, the actual phase of the clock signal CKW2 lags behind the ideal case of the clock signal CKW2, and the phase lag of the clock signal CKW2 is beyond (−180 degrees) of the clock signal CK (i.e., beyond (−90 degrees) of the clock signal CKCDC/CKW2). To solve this problem, the embodiment provides a training method to generate the control signals Vc1 and Vc2 to control the DCDL 126 and the multiplexer 128, respectively, to align the phases of the clock signals CKCDC and CKW2.

Figure 8:
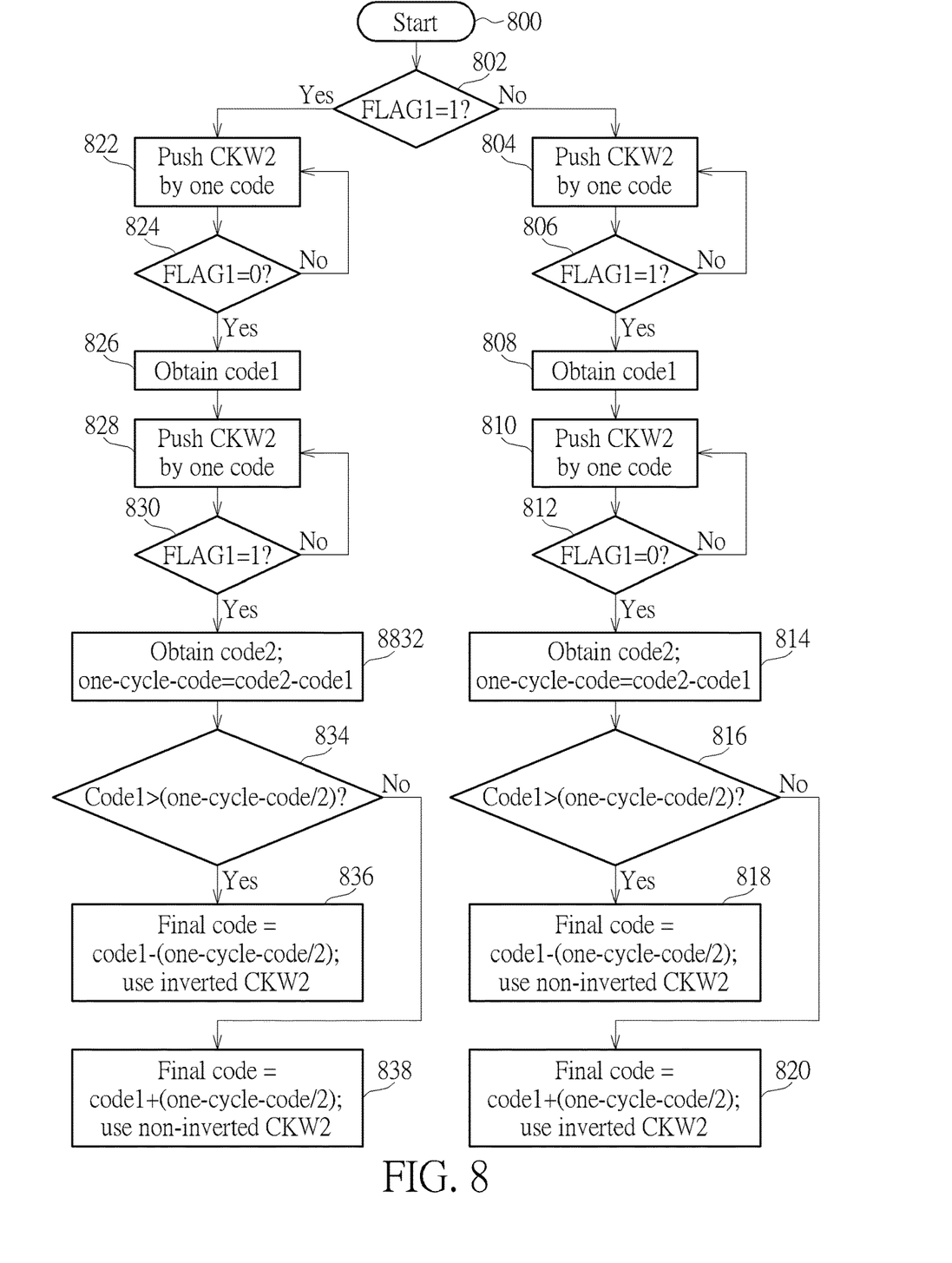
FIG. 8 is a flowchart of a training method of the clock signal generator according to one embodiment of the present invention.

FIG. 8 is a flowchart of a training method of the clock signal generator 200 according to one embodiment of the present invention. In Step 800, the flow starts, the control circuit 330 generates the control signal Vc1 to control the DCDL 126 have an initial code, wherein the initial code may be zero (i.e., minimum delay of the DCDL 126). In Step 802, the control circuit 330 determines if the sampling result FLAG1 outputted by the DFF 310 is equal to "1", if yes, the flow enters Step 822; and if not, the flow enters Step 804. In Step 804, the control circuit 330 generates the control signal Vc1 to increase the code of the DCDL 126 by one to increase the delay amount of the DCDL 126, to push the clock signal CKW2. In Step 806, the control circuit 330 determines if the sampling result FLAG1 outputted by the DFF 310 is equal to "1", if yes, the flow enters Step 808; and if not, the flow goes back to Step 804 to increase the code of the DCDL 126 by one to increase the delay amount of the DCDL 126 again. In Step 808, the control circuit 330 records the current code as a first code (i.e. code1 shown in FIG. 8). In Step 810, the control circuit 330 generates the control signal Vc1 to increase the code of the DCDL 126 by one to increase the delay amount of the DCDL 126. In Step 812, the control circuit 330 determines if the sampling result FLAG1 outputted by the DFF 310 is equal to "0", if yes, the flow enters Step 814; and if not, the flow goes back to Step 810 to increase the code of the DCDL 126 by one to increase the delay amount of the DCDL 126 again. In Step 814, the control circuit 330 records the current code as a second code (i.e. code2 shown in FIG. 8), and the control circuit 330 further calculates a one-cycle-code by subtracting the first code from the second code (i.e., one-cycle-code=code2−code1). In this embodiment, the one-cycle-code corresponds to 360 degrees of the clock signal CK or 180 degrees of the clock signal CKCDC/CKW2. At this time, the control circuit 330 may generate the control signal Vc1 to control the DCDL 126 to have the initial code.

In Step 816, the control circuit 330 determines if the first code is greater than half of the one-cycle-code, if yes, the flow enters Step 818; and if not, the flow enters Step 820. In Step 818, the control circuit 330 determines that the clock signal CKW2 belongs to case 2 shown in FIG. 7, and the control circuit 330 can generate the control signal Vc1 to use a final code to set the DCDL 126, wherein the final code is obtained by subtracting the half of the one-cycle-code by the first code, that is the final code is equal to "code1−one-cycle-code/2". In addition, the control circuit 330 generates the control signal Vc2 to control the multiplexer 128 to select the upper path, that is, to select the delayed clock signal outputted by the DCDL 126 to generate the clock signal CKW2. In Step 820, the control circuit 330 determines that the clock signal CKW2 belongs to case 1 shown in FIG. 7, and the control circuit 330 can generate the control signal Vc1 to use a final code to set the DCDL 126, wherein the final code is obtained by adding the half of the one-cycle-code to the first code, that is the final code is equal to "code1+one-cycle-code/2". In addition, the control circuit 330 generates the control signal Vc2 to control the multiplexer 128 to select the lower path, that is, to select the inverted delayed clock signal outputted by the inverter 127 to generate the clock signal CKW2.

In Step 822, the control circuit 330 generates the control signal Vc1 to increase the code of the DCDL 126 by one to increase the delay amount of the DCDL 126, to push the clock signal CKW2. In Step 824, the control circuit 330 determines if the sampling result FLAG1 outputted by the DFF 310 is equal to "0", if yes, the flow enters Step 826; and if not, the flow goes back to Step 822 to increase the code of the DCDL 126 by one to increase the delay amount of the DCDL 126 again. In Step 826, the control circuit 330 records the current code as a first code (i.e. code1 shown in FIG. 8). In Step 828, the control circuit 330 generates the control signal Vc1 to increase the code of the DCDL 126 by one to increase the delay amount of the DCDL 126. In Step 830, the control circuit 330 determines if the sampling result FLAG1 outputted by the DFF 310 is equal to "1", if yes, the flow enters Step 832; and if not, the flow goes back to Step 828 to increase the code of the DCDL 126 by one to increase the delay amount of the DCDL 126 again. In Step 834, the control circuit 330 records the current code as a second code (i.e. code2 shown in FIG. 8), and the control circuit 330 further calculates a one-cycle-code by subtracting the first code from the second code (i.e., one-cycle-code=code2−code1). In this embodiment, the one-cycle-code corresponds to 360 degrees of the clock signal CK or 180 degrees of the clock signal CKCDC/CKW2. At this time, the control circuit 330 may generate the control signal Vc1 to control the DCDL 126 to have the initial code.

In Step 834, the control circuit 330 determines if the first code is greater than half of the one-cycle-code, if yes, the flow enters Step 836; and if not, the flow enters Step 838. In Step 836, the control circuit 330 determines that the clock signal CKW2 belongs to case 3 shown in FIG. 7, and the control circuit 330 can generate the control signal Vc1 to use a final code to set the DCDL 126, wherein the final code is obtained by subtracting the half of the one-cycle-code by the first code, that is the final code is equal to "code1−one-cycle-code/2". In addition, the control circuit 330 generates the control signal Vc2 to control the multiplexer 128 to select the lower path, that is, to select the inverted delayed clock signal outputted by the inverter 127 to generate the clock signal CKW2. In Step 838, the control circuit 330 determines that the clock signal CKW2 belongs to case 4 shown in FIG. 7, and the control circuit 330 can generate the control signal Vc1 to use a final code to set the DCDL 126, wherein the final code is obtained by adding the half of the one-cycle-code to the first code, that is the final code is equal to "code1+one-cycle-code/2". In addition, the control circuit 330 generates the control signal Vc2 to control the multiplexer 128 to select the upper path, that is, to select the delayed clock signal outputted by the DCDL 126 to generate the clock signal CKW2.

By using the flowchart of the training method shown in FIG. 8, the phase of the clock signal CKW2 can be controlled to be close to the ideal case. Therefore, the clock signals CKCDC and CKW2 will have better timing margin, and the static skew between the clock signals CKCDC and CKW2 is reduced.

It is noted that the detailed operations shown in FIG. 8 is for illustrative purposes only, not a limitation of the present invention. Specifically, as long as the control circuit 330 can generates the control signal Vc1 to control the second path to have different delay amount, so that many sampling results FLAG1 corresponding to different delay amount of the second path are generated, and the control circuit 330 refers to many sampling results FLAG1 to determine a final code that is used to determine most suitable delay amount of the second path, the scope of the present invention is not limited to the detailed calculations shown in FIG. 8.

Figure 9:
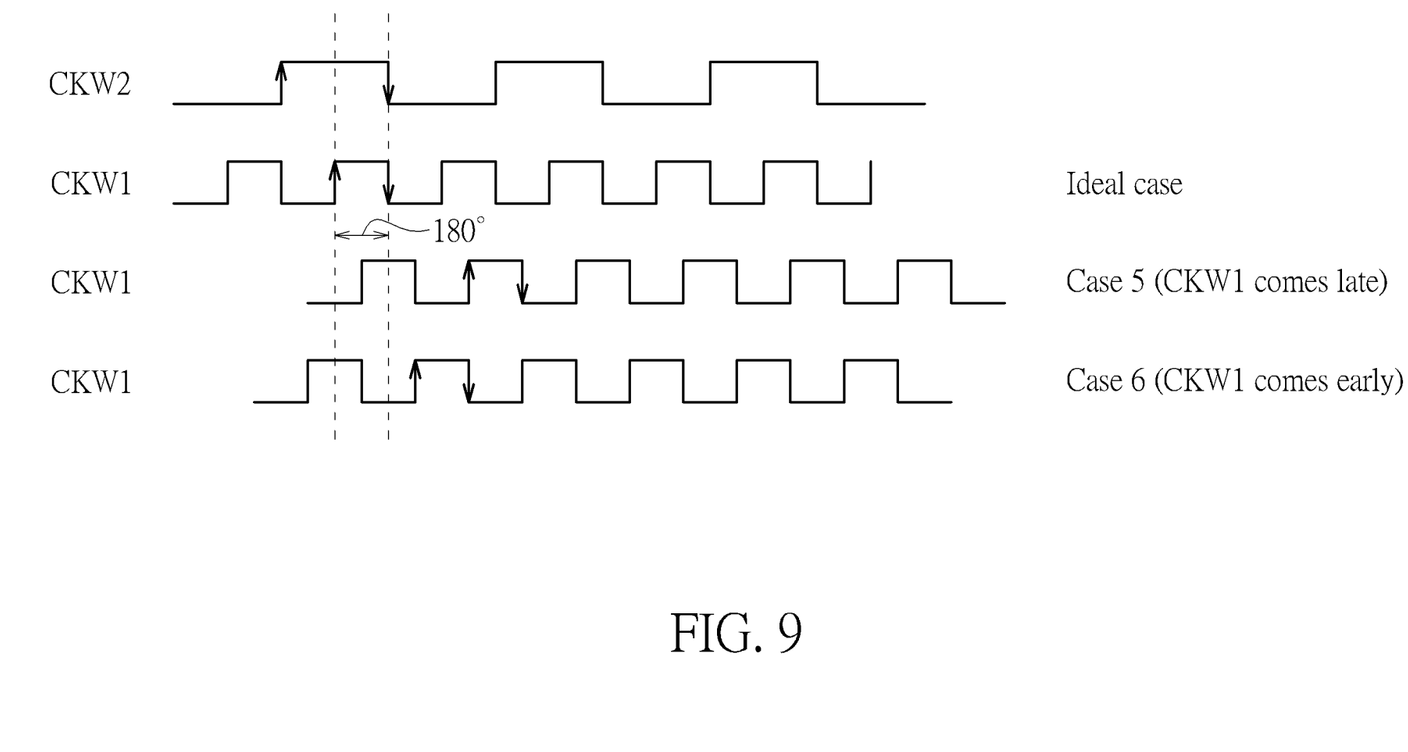
FIG. 9 shows phase differences between clock signals CKW1 and CKW2 for different cases.

In addition, regarding the phases of the clock signals CKW2 and CKW1, referring to FIG. 9, in an ideal case, a falling edge of the clock signal CKW1 is aligned to a falling edge of the clock signal CKW2, and in fact the phase difference between the clock signals CKW1 and CKW2 may belong to one of the following two cases. For a case 5, the clock signal CKW1 lags behind the clock signal CKW2; and for a case 6, the clock signal CKW1 leads the clock signal CKW2. The above two cases may make the physical interface 100 to generate incorrect output signal Vout. To solve this problem, the embodiment provides another a training method to generate the control signal Vc3 to control the DCDL 134, to align the phases of the clock signals CKW2 and CKW1.

Figure 10:
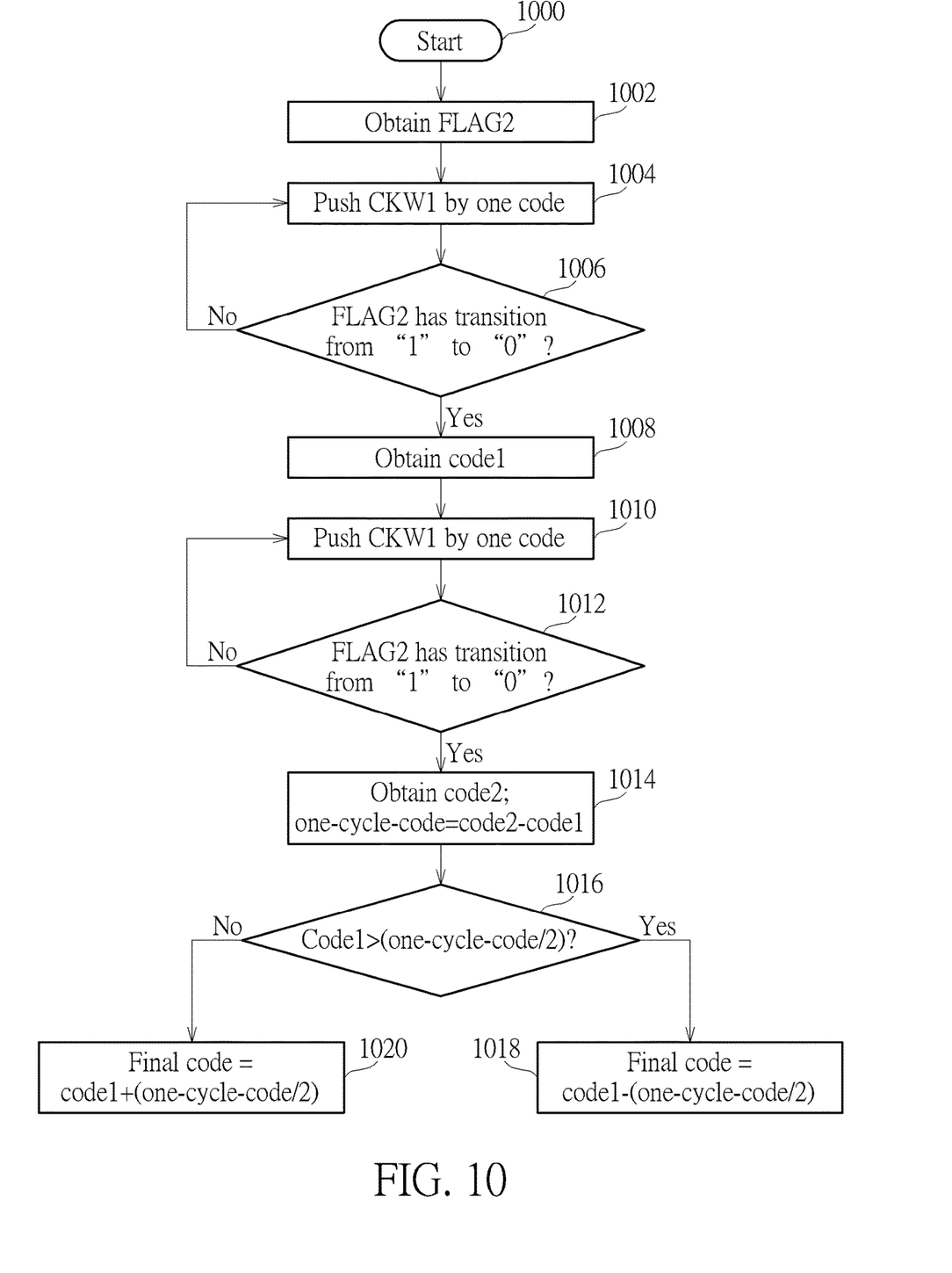
FIG. 10 is a flowchart of a training method of the clock signal generator according to one embodiment of the present invention.

FIG. 10 is a flowchart of a training method of the clock signal generator 200 according to one embodiment of the present invention. It is noted that the training method shown in FIG. 10 is performed after the training method shown in FIG. 8, that is the phase alignment of clock signals CKW2 and CKW1 is after the phase alignment of clock signals CKW2 and CKCDC. In Step 1000, the flow starts, the control circuit 330 generates the control signal Vc3 to control the DCDL 134 have an initial code, wherein the initial code may be zero (i.e., minimum delay of the DCDL 134). In Step 1002, the control circuit 330 records the sampling result FLAG2 outputted by the DFF 320. In Step 1004, the control circuit 330 generates the control signal Vc3 to increase the code of the DCDL 134 by one to increase the delay amount of the DCDL 134, to push the clock signal CKW1. In Step 1006, the control circuit 330 determines if the sampling result FLAG2 outputted by the DFF 320 has a transition from "1" to "0", if yes, the flow enters Step 1008; and if not, the flow goes back to Step 1004 to increase the code of the DCDL 134 by one to increase the delay amount of the DCDL 134 again. In Step 1008, the control circuit 330 records the current code as a first code (i.e. code1 shown in FIG. 10). In Step 1010, the control circuit 330 generates the control signal Vc3 to increase the code of the DCDL 134 by one to increase the delay amount of the DCDL 134. In Step 1012, the control circuit 330 determines if the sampling result FLAG2 outputted by the DFF 320 has a transition from "1" to "0", if yes, the flow enters Step 1014; and if not, the flow goes back to Step 1010 to increase the code of the DCDL 134 by one to increase the delay amount of the DCDL 134 again. In Step 1014, the control circuit 330 records the current code as a second code (i.e. code2 shown in FIG. 10), and the control circuit 330 further calculates a one-cycle-code by subtracting the first code from the second code (i.e., one-cycle-code=code2−code1). In this embodiment, the one-cycle-code corresponds to 360 degrees of the clock signal CK/CKW1. At this time, the control circuit 330 may generate the control signal Vc3 to control the DCDL 134 to have the initial code.

In Step 1016, the control circuit 330 determines if the first code is greater than half of the one-cycle-code, if yes, the flow enters Step 1018; and if not, the flow enters Step 1020. In Step 1018, the control circuit 330 determines that the clock signal CKW1 belongs to case 6 shown in FIG. 9, and the control circuit 330 can generate the control signal Vc3 to use a final code to set the DCDL 134, wherein the final code is obtained by subtracting the half of the one-cycle-code by the first code, that is the final code is equal to "code1−one-cycle-code/2". In Step 1020, the control circuit 330 determines that the clock signal CKW1 belongs to case 5 shown in FIG. 9, and the control circuit 330 can generate the control signal Vc3 to use a final code to set the DCDL 134, wherein the final code is obtained by adding the half of the one-cycle-code to the first code, that is the final code is equal to "code1+one-cycle-code/2".

By using the flowchart of the training method shown in FIG. 10, the phase of the clock signal CKW1 can be controlled to be close to the ideal case. Therefore, the clock signals CKW2 and CKW1 will have better timing margin, and the static skew between the clock signals CKW2 and CKW1 is reduced.

It is noted that the detailed operations shown in FIG. 10 is for illustrative purposes only, not a limitation of the present invention. Specifically, as long as the control circuit 330 can generates the control signal Vc3 to control the third path to have different delay amount, so that many sampling results FLAG2 corresponding to different delay amount of the second path are generated, and the control circuit 330 refers to many sampling results FLAG2 to determine a final code that is used to determine most suitable delay amount of the third path, the scope of the present invention is not limited to the detailed calculations shown in FIG. 10.

In the above embodiments, the timing margins between the clock signals CKCDC, CKW2 and CKW1 are improved without shifting the clock signal CKCDC in the digital domain, thereby maintaining synchronous behavior across multiple data physical circuitry and address physical circuitry.

Briefly summarized, in the present invention, by designing a physical layer having many sampling circuits and multiplexers to use a first clock signal, a second clock signal and a third clock signal corresponding to different clock domain to process quarter-rate data, and by designing a training mechanism to align the phases of the first clock signal, the second clock signal and the third clock signal, these clock signals will have better timing margins to reduce the static skew.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A physical layer, comprising:
a first group of sampling circuits, configured to use a first clock signal to sample a plurality of data to generate a plurality of first sampled data, respectively;
a second group of sampling circuits, configured to use a second clock signal to sample the plurality of first sampled data to generate a plurality of second sampled data, respectively;
a first multiplexer, configured to select one of a first signal and a second signal to generate a first multiplexer output, wherein the first signal and the second signal are obtained from part of the plurality of second sampled data;
a second multiplexer, configured to select one of a third signal and a fourth signal to generate a second multiplexer output, wherein the third signal and the fourth signal are obtained from another part of the plurality of second sampled data; wherein the third signal or the fourth signal is different from any one of the first signal and the second signal, and the part of the plurality of second sampled data is different from the another part of the plurality of second sampled data;
a third group of sampling circuits, configured to use a third clock signal to sample the first multiplexer output signal and the second multiplexer output signal to generate a plurality of third sampled data, respectively; and
a third multiplexer, configured to alternatively select one of the plurality of third sampled data to generate an output signal.

2. The physical layer of claim 1, wherein the first group of sampling circuits comprises four sampling circuits, the second group of sampling circuits comprises four sampling circuits, and the plurality of second sampled data comprise four sampled data; and a first of the four sampled data serves as the first signal, a second of the four sampled data is sampled by a sampling circuit using the second clock signal to generate the second signal, a third of the four sampled data serves as the third signal, and a fourth of the four sampled data is sampled by another sampling circuit using the second clock signal to generate the fourth signal.

3. The physical layer of claim 1, wherein the third group of sampling circuits comprises a first sampling circuit, a second sampling circuit and a third sampling circuit, the first sampling circuit is configured to use the third clock signal to sample the first multiplexer output signal to generate one of the plurality of third sampled data, the second sampling circuit is configured to use the third clock signal to sample the second multiplexer output signal to generate a sampled result, and the third sampling circuit is configured to use the third clock signal to sample the sampled result to generate another one of the plurality of third sampled data.

4. The physical layer of claim 1, further comprising:
a clock signal generator, configured to receive a clock signal to generate the first clock signal, the second clock signal and the third clock signal;
wherein the clock signal generator has a first path, a second path and a third path, the first path is configured to generate the first clock signal whose frequency is half a frequency of the clock signal, the second path is configured to generate the second clock signal whose frequency is half the frequency of the clock signal, and the third path is configured to generate the third clock signal whose frequency is equal to the frequency of the clock signal.

5. The physical layer of claim 4, further comprising:
a control circuit, configured to generate a first control signal to control delay amount of the second path according to phase information of the first clock signal and the second clock signal.

6. The physical layer of claim 5, further comprising:
a first sampling circuit, configured to use the first clock signal to sample the second clock signal to generate a first sampling result;
wherein the control circuit generates the first control signal to control delay amount of the second path according to the first sampling result.

7. The physical layer of claim 6, wherein the control circuit generates the first control signal to control the second path to have different delay amount, so that the first sampling circuit generates a plurality of first sampling results corresponding to different delay amount of the second path; and the control circuit refers to the plurality of first sampling results to determine a final code that is used to determine the delay amount of the second path.

8. The physical layer of claim 6, wherein the second path comprises:
a delay line, controlled by the first control signal to generate a delayed clock signal;
an inverter, configured to receive the delayed clock signal to generate an inverted delayed clock signal;
a fourth multiplexer, configured to select one of the delayed clock signal and the inverted delayed clock signal to generate the second clock signal;
wherein the control circuit further generates a second control signal to control the fourth multiplexer to select one of the delayed clock signal and the inverted delayed clock signal to generate the second clock signal.

9. The physical layer of claim 5, wherein the control circuit is further configured to generate a third control signal to control delay amount of the third path according to phase information of the second clock signal and the third clock signal.

10. The physical layer of claim 9, further comprising:
a second sampling circuit, configured to use the second clock signal to sample the third clock signal to generate a second sampling result;
wherein the control circuit generates the third control signal to control delay amount of the third path according to the second sampling result.

11. The physical layer of claim 10, wherein the control circuit generates the third control signal to control the third path to have different delay amount, so that the second sampling circuit generates a plurality of second sampling results corresponding to different delay amount of the third path; and the control circuit refers to the plurality of second sampling results to determine a final code that is used to determine the delay amount of the third path.

12. The physical layer of claim 1, wherein the physical layer is applied to a double data rate synchronous dynamic random access memory (DDR SDRAM).

13. A signal processing method, comprising:
- using a first clock signal to sample a plurality of data to generate a plurality of first sampled data, respectively;
- using a second clock signal to sample the plurality of first sampled data to generate a plurality of second sampled data, respectively;
- selecting one of a first signal and a second signal to generate a first multiplexer output, wherein the first signal and the second signal are obtained from part of the plurality of second sampled data;
- selecting one of a third signal and a fourth signal to generate a second multiplexer output, wherein the third signal and the fourth signal are obtained from another part of the plurality of second sampled data wherein the third signal or the fourth signal is different from any one of the first signal and the second signal, and the part of the plurality of second sampled data is different from the another part of the plurality of second sampled data;
- using a third clock signal to sample the first multiplexer output signal and the second multiplexer output signal to generate a plurality of third sampled data, respectively; and
- alternatively selecting one of the plurality of third sampled data to generate an output signal.

14. The signal processing method of claim 13, further comprising:
- using a first path of a clock signal generator to receive a clock signal to generate the first clock signal whose frequency is half a frequency of the clock signal;
- using a second path of the clock signal generator to receive the clock signal to generate the second clock signal whose frequency is half the frequency of the clock signal; and
- using a third path of the clock signal generator to receive the clock signal to generate the third clock signal whose frequency is equal to the frequency of the clock signal.

15. The signal processing method of claim 14, further comprising:
- generating a first control signal to control delay amount of the second path according to phase information of the first clock signal and the second clock signal.

16. The signal processing method of claim 15, further comprising:
- using the first clock signal to sample the second clock signal to generate a first sampling result;
- wherein the step of generating the first control signal to control delay amount of the second path according to the phase information of the first clock signal and the second clock signal comprises:
  - generating the first control signal to control delay amount of the second path according to the first sampling result.

17. The signal processing method of claim 16, wherein the step of generating the first control signal to control delay amount of the second path according to the first sampling result comprises:
- generating the first control signal to control the second path to have different delay amount;
- using the first clock signal to sample the second clock signal to generate a plurality of first sampling results corresponding to different delay amount of the second path; and
- referring to the plurality of first sampling results to determine a final code that is used to determine the delay amount of the second path.

18. The signal processing method of claim 16, wherein the step of using the second path of the clock signal generator to receive the clock signal to generate the second clock signal whose frequency is half the frequency of the clock signal comprises:
- using a delay line controlled by the first control signal to generate a delayed clock signal;
- using an inverter to receive the delayed clock signal to generate an inverted delayed clock signal; and
- generating a second control signal to select one of the delayed clock signal and the inverted delayed clock signal to generate the second clock signal.

19. The signal processing method of claim 15, further comprising:
- generating a third control signal to control delay amount of the third path according to phase information of the second clock signal and the third clock signal.

20. The signal processing method of claim 19, further comprising:
- using the second clock signal to sample the third clock signal to generate a second sampling result;
- wherein the step of generating the third control signal to control the delay amount of the third path according to phase information of the second clock signal and the third clock signal comprises:
  - generating the third control signal to control the delay amount of the third path according to the second sampling result.

* * * * *